United States Patent [19]

Miller et al.

[11] 4,301,399
[45] Nov. 17, 1981

[54] MONITORING OF ELECTRICAL INSULATION INTEGRITY

[75] Inventors: Harvey A. Miller, Tequesta; Jon P. Newman, North Palm Beach; Charles R. Yemington, Palm Beach Gardens, all of Fla.

[73] Assignee: Perry Oceanographics, Inc., Riviera Beach, Fla.

[21] Appl. No.: 54,401

[22] Filed: Jul. 3, 1979

[51] Int. Cl.³ .............................................. G01R 31/12
[52] U.S. Cl. ................................... 324/54; 324/58 R
[58] Field of Search ..................... 324/58 R, 58 A, 54

[56] References Cited

U.S. PATENT DOCUMENTS

| | | |
|---|---|---|
| 2,453,313 | 11/1948 | Gordon . |
| 3,156,863 | 11/1964 | Wakefield . |
| 3,217,244 | 11/1965 | Glover . |
| 3,399,342 | 8/1968 | Fligel . |
| 3,411,078 | 11/1968 | Hartman . |
| 3,633,194 | 1/1972 | Kothe .................... 324/54 |
| 3,648,282 | 3/1972 | Kelly ..................... 324/54 |
| 3,714,455 | 1/1973 | Chepelev . |
| 3,803,484 | 4/1974 | Gray ...................... 324/54 |
| 3,991,363 | 11/1976 | Lathrop . |
| 4,054,832 | 10/1977 | Reynolds ............... 324/54 |
| 4,200,836 | 4/1980 | Okada .................... 324/54 |
| 4,214,311 | 7/1980 | Nakashima ............ 324/54 |

Primary Examiner—Michael J. Tokar
Attorney, Agent, or Firm—Spencer & Kaye

[57] ABSTRACT

The integrity of the insulation of an electrical device composed of at least two conductive members having a potential therebetween and at least two insulating layers successively surrounding the conductive members, is monitored by interposing an electrically conductive, integrity monitoring layer between the two insulating layers so that a first one of the insulating layers is disposed between the conductive members and the conductive layer and a second one of the insulating layers is disposed between the conductive layer and the environment surrounding the device, monitoring the impedance of the first layer between the conductive members and the conductive layer, and monitoring the impedance of the second layer between the conductive layer and the surrounding environment.

13 Claims, 4 Drawing Figures

MONITORING OF ELECTRICAL INSULATION INTEGRITY

BACKGROUND OF THE INVENTION

The present invention relates to a method and system for monitoring the integrity of electrical insulation, particularly on a continuous basis while the electrical device protected by such insulation is in use.

While the insulation provided around electrical power conductors and equipment is designed to prevent the appearance of short circuits or excessive currents between members which are at different potentials, and to protect personnel against shock hazards, and the insulation provided for a particular system can be expected to perform this function as long as it is in good condition, insulation can experience deterioration which, after a period of time, will destroy its protective abilities. Such deterioration is particularly likely in the case of power cable systems or equipment which are not stationary, in which case they are subjected to flexing, impact, abrasion, etc., which will accelerate the deterioration of the insulating system.

The problems posed by such deterioration are particularly acute in the case of cable systems and equipment utilized in or near water, and especially for those systems which are in contact with sea water, which has an extremely low electrical resistance. Thus, adequate protection of equipment and personnel in such an environment requires special measures.

One possibility which has been suggested involves the use of a "floating" power system, i.e. one having no ground, so that the first ground fault will have no hard wire return path. However, this approach is not completely reliable because particular combinations of conductor line length, power frequency, and operating voltage normally have high distributed capacitive and resistive leakage currents which can mask or hide hazardous current levels which might occur at isolated points of insulation degradation. The appearance of such currents cannot be reliably monitored by ground leakage current detectors because normal variations in distributed leakage currents exceed the current level which is hazardous if it occurs at a fault point. In particular, when the normal capacitive coupling which exists between power conductors and sea water is high, previously existing detectors cannot be usefully set to take into account the fact that changes in the length of cable immersed in the water, particularly when the cable is being payed out or hauled in, produce a corresponding change in the value of the distributed capacitive leakage current through the insulation between the cable conductors and the sea water ground.

It has also been suggested to eliminate shock hazards by enclosing a cable in a conductive armor which will act to carry ground fault currents. However, a conductive armor which is substantial enough to carry anticipated ground fault currents without creation of an unacceptably high voltage between the longitudinal ends of the armor would be so heavy and stiff as to prevent handling and winching of the cable on a practical basis. Moreover, even conductive armor is subject to deterioration and failure, which would destroy its ability to carry ground fault currents but would normally go undetected.

It is currently a common practice to provide double insulation in those systems where maintenance of the integrity of the insulation is particularly important. However, even double insulation is subjected to deterioration due to wear, age and damage, which can render the insulation unsafe, but which, here again, will not be detected by prior art techniques until damage or injury occurs.

In addition, various schemes have already been proposed for interrupting a ground fault path through the use of circuit breakers which operate upon the first appearance of a ground fault current. Most of these systems can be arranged to protect equipment, but do not fully protect personnel against shocks.

A recently proposed system of the latter type, which is designed for use in house power systems, compares the currents in the "hot" and return lines of such a system and operates to break the current circuit if an unbalance should occur, as for example if insulation should become defective and a person should become a part of the current flow path, as by touching a bare wire on the "hot" of the power line. This system senses the current change resulting from such contact, and interrupts the power system in response thereto. However, it does not provide any forewarning of deterioration of the conductor insulation, and does not operate until a person comes in contact with a bare spot of the conductor.

While such devices may prove beneficial in house wiring systems, they are unusable in a practical basis for long conductor systems, high voltage or high power systems, or in subsea applications, because underwater cables and equipment are normally not grounded, and always present a relatively high normal leakage current. Furthermore, devices of this type are capable of operating only with single phase power systems, and cannot be arranged to operate with multiphase systems.

Procedures are also known for measuring deterioration of cable insulation between uses. For this purpose, a particular cable must be removed from its working environment and tested in a controlled environment by the application of special voltages. Of course, this procedure does not permit incipient shock hazards to be detected between tests.

SUMMARY OF THE INVENTION

It is a primary object of the present invention to provide improved protection against the adverse effects of insulation breakdowns.

A further object of the invention is to continuously monitor insulation integrity while the conductor system or equipment protected by such insulation is in use.

Another object of the invention is to provide a warning of the development of conditions which will lead to appearance of a shock hazard, before that hazard actually comes into existence.

These and other objects are achieved, according to the invention, by a method for monitoring the integrity of the insulation of an electrical device having at least two conductive members having a potential therebetween and at least two insulating layers successively surrounding the conductive members, which method includes interposing an electrically conductive, integrity monitoring layer between the two insulating layers so that a first one of the insulating layers is disposed between the conductive members and the conductive layer and a second one of the insulating layers is disposed between the conductive layer and the environment surrounding the device; monitoring the impedance of the first layer between the conductive members and the conductive layer; and monitoring the impedance of the second layer between the conductive layer and the surrounding environment.

The objects of the invention are further achieved by a system for monitoring the integrity of two layers of insulation forming part of an electrical device which further includes at least two conductive members having a potential therebetween and surrounded successively by the two layers of insulation, which system includes: means defining a conductive, integrity monitoring layer interposed between the two layers of insulation such that a first one of the layers of insulation is disposed between the conductive members and the conductive layer and a second one of the layers of insulation is disposed between the conductive layer and the environment surrounding the device; a first impedance monitoring circuit connected between the conductive members and the conductive layer for monitoring the capacitive and resistive leakage current through the first insulating layer; and a second impedance monitoring circuit connected between the conductive layer and the environment surrounding the device for monitoring the current through the second insulating layer.

DESCRIPTION OF THE PREFERRED EMBODIMENTS

Figure 1:
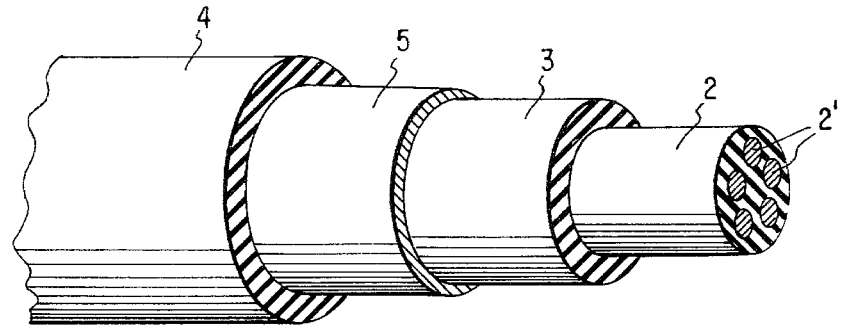
FIG. 1 is perspective, cut-away view of a power cable arrangement constructed for use in a monitoring system according to the present invention.

The cable 1 shown in FIG. 1 is composed of a core 2 containing a plurality of conductive members, or conductors, 2' which are usually individually insulated, connected to form a single phase or multiphase power transmission path. Conductors 2' can be embedded in an insulating mass and/or can be bundled or stranded together.

The core 2 is enclosed by inner and outer insulating layers 3 and 4 which, according to the invention, are separated by a conductive integrity monitoring layer 5 which can be connected to a circuit for monitoring the integrity of both insulating layers 3 and 4.

Figure 2:
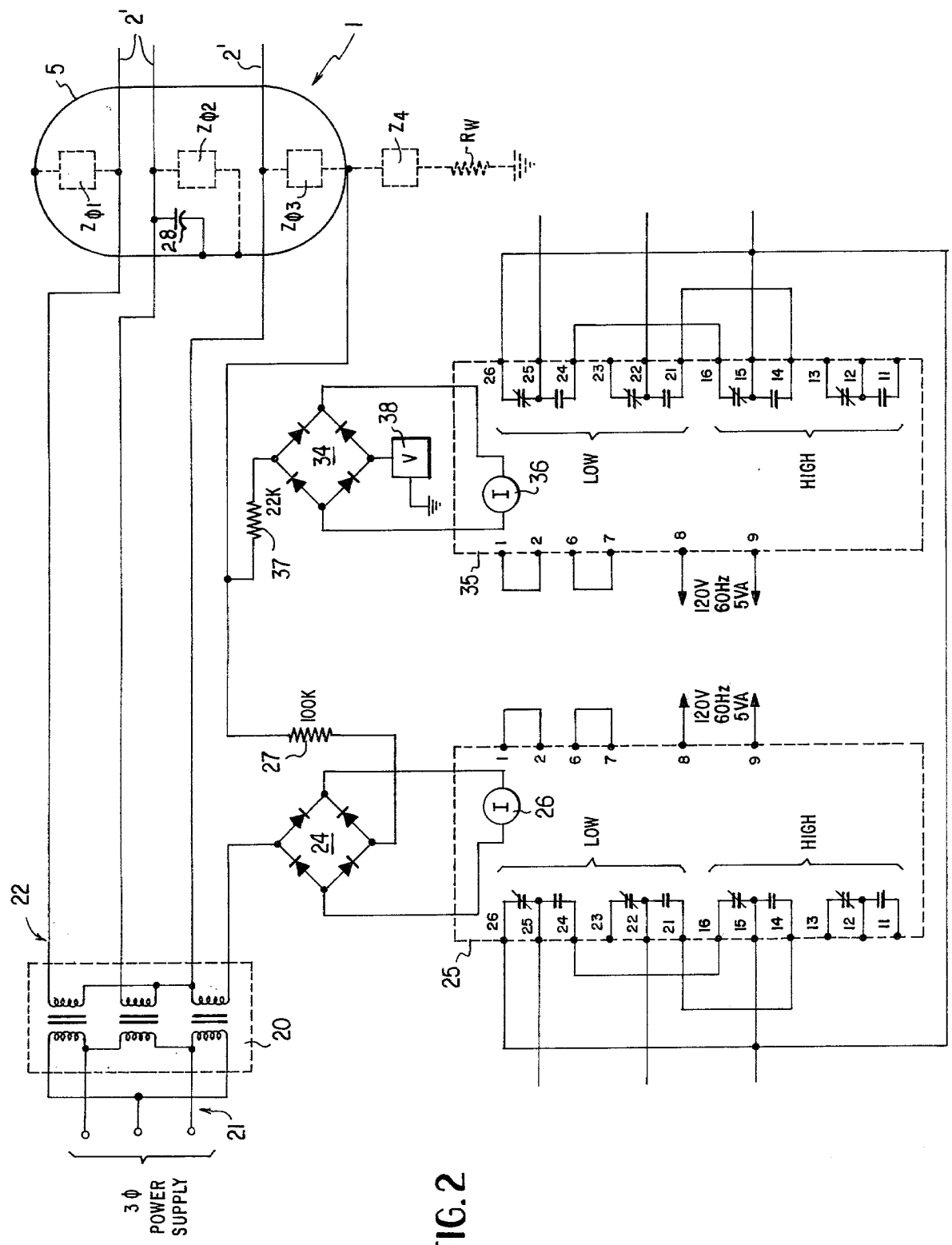
FIG. 2 is a circuit diagram of a preferred embodiment of a monitoring system according to the invention, connected to the cable of FIG. 1.

One suitable and effective embodiment of such a monitoring circuit is shown in FIG. 2, in which conductors 2' form a 3-phase transmission path, receiving power from the ungrounded Y-connected secondaries 22 of a Δ-Y transformer 20 whose primaries 21 are connected in a Δ-pattern to a 3-phase power source. The impedance provided by layer 3 between each conductor phase and conductive layer 5 is represented by impedance components $Z_{\phi 1}$, $Z_{\phi 2}$ and $Z_{\phi 3}$, while the impedance provided by layer 4 between conductive layer 5 and a surrounding low resistance medium is represented by impedance component $Z_4$. When cable 1 is immersed in sea water, the resistance between the cable and the monitoring circuit ground, represented by resistor $R_w$, is of the order of 1 ohm as long as the distance therebetween is not extremely long.

In order to monitor the state of layer 3, there is provided a sensing circuit unit composed of a first full wave rectifier 24 connected to effect full wave rectification of the voltage between the neutral point of the 3-phase Y connection to conductors 2' and conductive layer 5. This rectification is necessary only if the display device (meter) requires a d.c. signal. In virtually every installation, some imbalance will exist between impedance components $Z_{\phi 1}$, $Z_{\phi 2}$ and $Z_{\phi 3}$, resulting in an initial voltage difference between the neutral point and shield 5. Readings of less than this initial value indicate component failure, and thus provide the basis for achieving fail-safe operation. Readings higher than the initial reading indicate a reduction in the value of one of the resistive paths inherent in $Z_{\phi 1}$, $Z_{\phi 2}$, or $Z_{\phi 3}$. The rectified current from bridge 24 is applied to ammeter 26 of a first control device 25 of the type which can be set to produce a signal when the current through ammeter 26 falls outside, i.e. above or below, a selected range.

Any deterioration in the insulation layer 3 reduces its impedance, causing a corresponding increase in the meter reading.

Connected in series with the a.c., or input, side of rectifier 24 is an adjustment resistor 27 whose value is selected, on the basis of the full scale range of ammeter 26, the voltage level supplied to conductors 2', the length of the cable, and the insulation thickness, to establish the desired relationship between degree of insulation deterioration and change in ammeter reading. Similarly, a capacitor 28 connected between shield 5 and one conductive member 2' is given a value selected to cause the ammeter to produce a desired initial current reading at the start of operation when the insulation is sound.

Thereafter, a substantial rise in that reading indicates insulation deterioration while a decrease in the reading indicates a failure in the monitoring system. Thus, the system is inherently fail-safe.

As one example, the value of capacitor 28 could be selected to cause the initial reading of ammeter 26 to be at or just above 20% of full scale and device 25 could be set to produce an indication of insulation failure upon occurrence of a current reading exceeding 60-80% of full scale, and an indication of power or instrument failure upon occurrence of a current reading below 20% of full scale.

Figure 3:
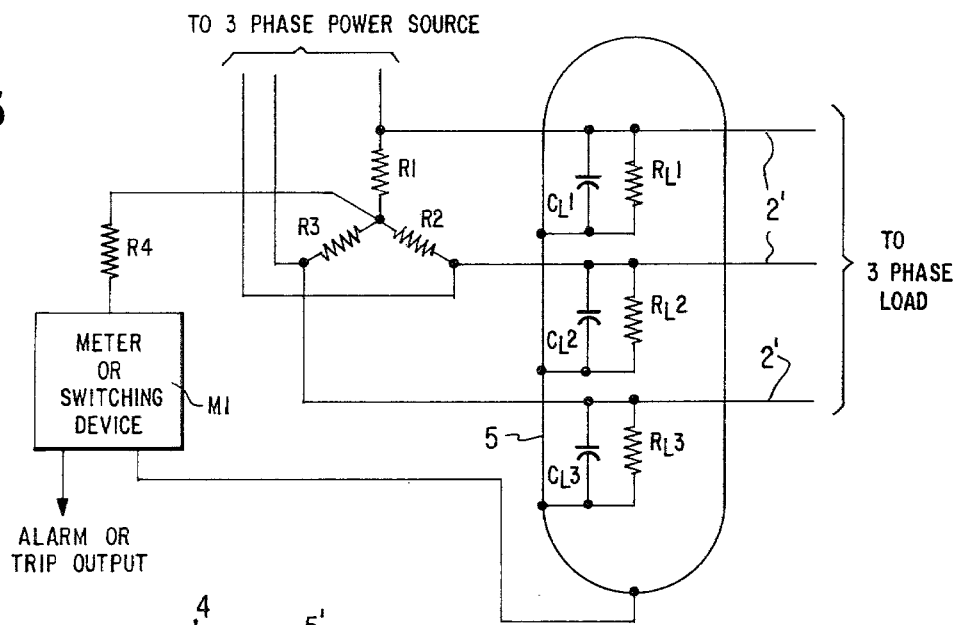
FIG. 3 is a circuit diagram illustrating application of the invention to a delta-connected power transmission system.

While FIG. 2 shows the connection of the monitoring device to a 3-phase Wye connected power transmission cable, FIG. 3 shows an alternate connection method which can be used with ungrounded delta connected power transmission cables as well. In FIG. 3, members 2' constitute an ungrounded 3-phase, a.c. power transmission system and resistors $R_1$, $R_2$, and $R_3$ are connected to each other and to the three conductive members 2' so as to create a virtual neutral which will float at some potential with respect to the conductive shield 5. This potential is substantially independent of the relative balance or unbalance of the 3-phase electrical load, but is directly related to the net unbalance in leakage currents through $Z_{\phi 1}$, $Z_{\phi 2}$ and $Z_{\phi 3}$, i.e. through $R_{L1}$ and $C_{L1}$, $R_{L2}$ and $C_{L2}$, and $R_{L3}$ and $C_{L3}$ where $C_{L1}$, $C_{L2}$ and $C_{L3}$ are the distributed leakage capacitances and $R_{L1}$, $R_{L2}$, and $R_{L3}$ are the distributed leakage resistances from each respective one of members 2'. If the capacitance and resistance values of these respective components were equal, and since $R_1 = R_2 = R_3$, the shorting out of distributed leakage current along the line length by the conductive sensor would result in no potential across the current limiting resistor $R_4$, and no current through a meter M-1, which corresponds to components 24, 25, 34 and 35 of FIG. 2. However, there will always be some unbalance in the distributed impedances. These unbalances result from manufacturing tolerances. Thus, there will be a low level initial reading on a properly chosen meter.

Any deterioration of insulation between a power conductor and the conductive sensor is indicated by a change in meter reading. Changing the percentage of the cable which is submerged will not affect the output since the conductive shield 5 works equally well submerged or at the surface. Some deterioration over the life of the cable is expected and can be tolerated; the amount of deterioration that is acceptable is a function of the cable type and application. The acceptable limit can easily be calculated and used as the threshold for an alarm or trip output from the meter, or an amplifier, in each particular application.

Since the meter initially sees a non-zero quiescent leakage current and gives an alarm or trip signal when this current changes, the system is essentially fail-safe. It will give an output if any component failure causes a deviation in this current.

With the measuring arrangement of either of FIGS. 2 and 3, the condition of layer 4 can be monitored substantially independently of that of layer 3 because conductive layer 5 acts as a Faraday shield which completely encloses layer 3 and virtually eliminates all leakage current flow between layers 3 and 4 and any electrical noise potential between conductors 2' and the system ground. This permits the integrity of insulation layer 4 to be monitored by a low, and therefore non-hazardous, monitoring voltage applied across the outer insulation layer 4. Conductive layer 5 also serves as a pseudo ground plane so that leakage currents from the conductive members do not change as greater or lesser amounts of the cable are submerged in sea water.

FIG. 2 illustrates one suitable arrangement for monitoring layer 4, this arrangement being composed essentially of a low level voltage source and a second full wave rectifier 34 and a second control device 35 containing an ammeter 36.

One terminal at the input side of rectifier 34 is connected via a setting resistor 37 to shield 5, while a voltage source 38 is connected between the other terminal at the input side of rectifier 34 and system ground. The value of resistor 37 is selected on the basis of considerations similar to those underlying selection of the value of resistor 27 and the voltage produced by source 38 is selected to produce the desired initial current reading when layer 4 is sound.

When a monitoring system according to the invention is, typically, mounted on a ship from which cable 1 extends, connection between the monitoring system ground and the sea can be effected by connecting the system ground to the hull of the ship. Alternatively, a ground electrode can be connected to the monitoring system ground and introduced into the sea.

Device 35 can, like device 25, be set to produce an initial reading just above 20% of full scale and to provide an indication of insulation deterioration when the reading exceeds 60-80% of full scale and an indication of system failure if the reading drops below 20% of full scale.

If source 38 is a d.c. voltage source, rectifier 34 can be eliminated and the ammeter 36 can be connected directly between one side of voltage source 38 and resistor 37. In addition, if, in each sensing circuit unit, an a.c. signal is to be sensed, the rectifier bridge can be eliminated and meter 26 or 36 can be constituted by an a.c. ammeter.

In one specific, exemplary embodiment of the invention, for monitoring a 3-phase conductor system supplied with 3-phase power at 480 V, from secondaries 22, resistors 27 and 37 may typically have the values shown in FIG. 2, ammeters 26 and 36 have a full scale range of 0-1 ma and source 38 produces an output of the order of 60 V. Each monitoring unit is set to have its associated ammeter 26 or 36 produce an initial reading at or slightly above 0.2 ma when the insulation layers are sound, and each device 25 and 35 is arranged to produce an alarm or shut-off signal when its associated ammeter reading falls below 0.2 ma or exceeds an upper limit having a value located between 0.6 and 0.8 ma, the exact value being based on a determination of the amount of insulation deterioration which can be accepted before an unsafe condition exists.

If the central core 2 is connected to conduct d.c. power, the integrity of insulation layer 3 can be monitored by inserting a voltage source in series with ammeter 26 and the leakage current path between core 2 and shield 5. If core 2 is conducting ungrounded single phase a.c., the voltage source of the monitoring circuit is not required. If core 2 is conducting d.c. power, the monitoring unit voltage source can provide a.c. and either ammeter 26 is an a.c. ammeter or bridge rectifier 24 is provided. In this way it is assured that the current being conducted by core 2 will not interfere with the monitoring current.

Each of devices 25 and 35 can be constituted by a commercially available device, such as a Simpson 3323XA meter relay having a 0-1 ma ammeter, which can be set to provide an output indication, as by actuating a relay, when the meter reading falls below, or exceeds, particular lower and upper limits, which can be set as desired. FIG. 2 illustrates the pin connections for that meter relay type.

Figure 4:
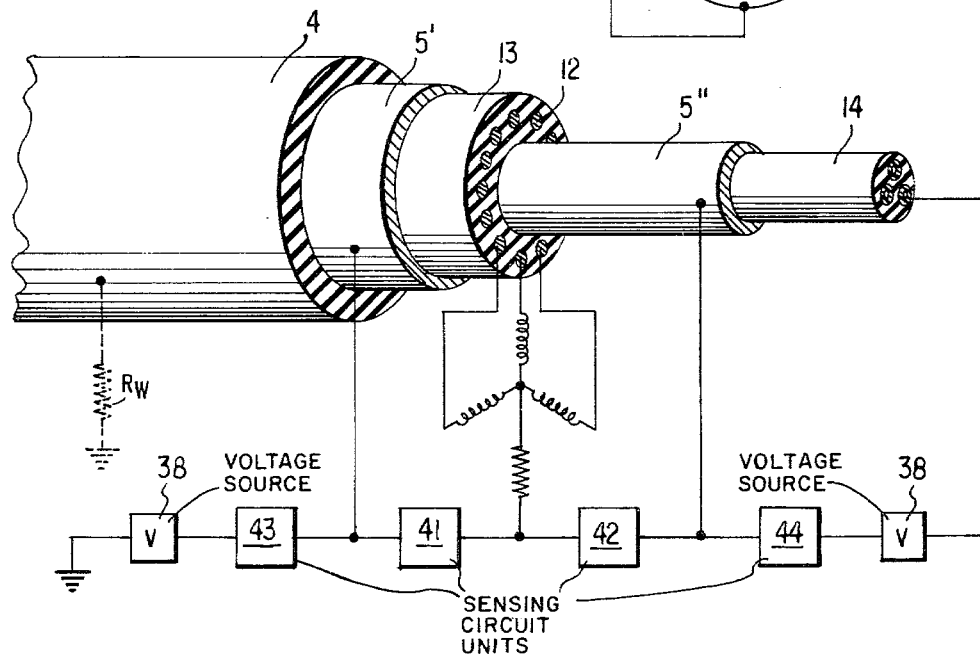
FIG. 4 is partly a perspective, cut-away view and partly a circuit diagram of another cable structure connected to a second preferred embodiment of a monitoring system according to the invention.

FIG. 4 illustrates a further embodiment of the invention in which the basic concept of the invention is extended to a cable having two sets of conductors, including data signal conductors and power conductors, and more than two insulation layer portions to be monitored. The cable illustrated there includes a central communications core 14 composed of several coaxial or twinax lines embedded in an insulating body and a surrounding annular array of power conductors 12 embedded in an insulating layer 13. An outer insulating layer 4 encloses layer 13.

A first conductive layer 5' forms a Faraday shield between insulating layers 4 and 13, while a second conductive layer 5" forms a similar shield between core 14 and insulation 13.

Simply by way of example, conductors 12 are shown connected as a 3-phase power transmission system. The neutral or virtual neutral of the 3-phase supply is connected to a respective input of each of two sensing circuit units 41 and 42, each of which has a second input connected to a respective one of the conductive layers 5' and 5". Each unit 41 and 42 could have the form of the structure represented by components 24-27 of FIG. 2. Similarly a further sensing circuit 43 with an associated voltage source 38 is connected between conductive layer 5' and ground, and a similar sensing circuit 44 with an associated voltage source 38 is connected between a part of one coaxial line, preferably its outer conductor, or the circuit common of all coaxial leads, and conductive layer 5''. Each of units 43 and 44 can have the form of components 34-37 of FIG. 2.

Thus, in the system shown in FIG. 4, each unit 41 and 42 monitors a respective portion of insulating layer 13 between conductors 12 and a respective one of conductive layers 5' and 5'', unit 43 monitors outer insulating layer 4 and unit 44 monitors the insulation of core 14 between the signal conductors therein and conductive layer 5''. Selection of the circuit values and operating parameters of each of units 41-44 would be effected on the basis of the considerations described above with reference to FIG. 2.

The form in which connections are shown in FIG. 4 between the cable and the monitoring system is only for purpose of illustration and is not intended to suggest the specific manner in which such connections are made in practice. Instead, the monitoring system will usually be connected to terminals provided at one end of such a cable.

For practice of the invention, layer 5 can have any form which causes it to behave as a conductive layer with respect to conductors 2'. Thus, layer 5 could be formed of a continuous sheet of conductive material or of a layer of resistive material having conductors embedded therein. In one practical embodiment of the invention which has been designed, layer 5 was constituted by layer, or matrix, of conductive rubber having relatively thick (#8) bare copper conductors embedded therein, each copper conductor extending the length of the cable.

Among the significant advantages of the monitoring operation according to the invention are that it enables the condition of the various insulating layers to be monitored continuously and independently, and allows an unsafe condition of one insulating layer to be detected while the other insulating layer or layers continue to provide shock protection.

It will be understood that the above description of the present invention is susceptible to various modifications, changes and adaptations, and the same are intended to be comprehended within the meaning and range of equivalents of the appended claims.

What is claimed is:

1. A method for monitoring the integrity of the insulation of an electrical device having at least two conductive members having a potential therebetween and at least two insulating layers successively surrounding the conductive members, said method comprising interposing an electrically conductive, integrity monitoring layer between the two insulating layers so that a first one of the insulating layers is disposed between the conductive members and the conductive layer and a second one of the insulating layers is disposed between the conductive layer and the environment surrounding the device; monitoring the impedance of the first layer between the conductive members and the conductive layer; and monitoring the impedance of the second layer between the conductive layer and the surrounding environment.

2. A method as defined in claim 1 wherein the electrical device is present in a surrounding environment having a low electrical resistance, and each of said steps of monitoring is carried out by monitoring the amplitude of the current flowing through the respective insulating layer in response to an electrical potential.

3. A method as defined in claim 2 wherein, in each said monitoring step, the electrical potential across the respective insulating layer has a value sufficient to cause a predetermined minimum current to flow through the associated insulating layer when that layer presents a satisfactory insulating impedance.

4. A method as defined in claim 1 wherein the electrical device is a power cable.

5. A method as defined in claim 4 wherein said power cable is connected to conduct power supplied by a source having a neutral line, and said step of monitoring the impedance of the first layer is carried out by measuring the current between the neutral line and said conductive layer.

6. A method as defined in claim 4, wherein said power cable is connected to conduct power supplied by a source not having an associated neutral line, and said step of monitoring the impedance of the first layer is carried out by connecting instrumentation impedances to the source to form a virtual neutral point, and measuring the current between the virtual neutral point and said conductive layer.

7. A method as defined in claim 1 wherein said step of monitoring the impedance of the second layer comprises connecting a voltage source between said conductive layer and the surrounding environment.

8. A method as defined in claim 1 wherein said steps of monitoring are carried out continuously while said device is in use.

9. A method as defined in claim 1 wherein said steps of monitoring include providing an output alarm signal upon the occurrence of either an unsafe condition or a failure of the monitoring equipment.

10. A method as defined in claim 1 wherein said steps of monitoring are carried out while the conductive member is in use to carry electrical power to a 3-phase load.

11. A method as defined in claim 1 wherein said steps of monitoring are carried out while the conductive members are in use to carry electrical power and the device is at least partly submerged in a conductive medium, and wherein the monitoring result is independent of the length of the device submerged in the conductive medium.

12. A system for monitoring the integrity of at least two layers of insulation forming part of an electrical device which further includes at least two conductive members having a potential therebetween and surrounded successively by the two layers of insulation, said system comprising: means defining a conductive, integrity monitoring layer interposed between said two layers of insulation such that a first one of said layers of insulation is disposed between the conductive members and said conductive layer and a second one of said layers of insulation is disposed between said conductive layer and the environment surrounding the device; a first impedance monitoring circuit connected between the conductive members and said conductive layer for monitoring the current passing through said first insulating layer under the influence of the potentials on said conductive members; and a second impedance monitoring circuit connected between said conductive layer and the environment surrounding the device for monitoring the current through said second insulating layer.

13. A method as defined in claim 8 wherein the potential between said conductive members is the normal operating potential of said device and said step of monitoring the impedance of the first layer comprises monitoring the current generated in said first layer by such potential.

* * * * *